United States Patent
Pang

(10) Patent No.: US 6,566,146 B1
(45) Date of Patent: May 20, 2003

(54) METHOD FOR DOUBLE-SIDED PATTERNING OF HIGH TEMPERATURE SUPERCONDUCTING CIRCUITS

(76) Inventor: Philip Shek Wah Pang, 100 Andrew Cir., Media, PA (US) 19063

( * ) Notice: Subject to any disclaimer, the term of this patent is extended or adjusted under 35 U.S.C. 154(b) by 0 days.

(21) Appl. No.: 09/743,082

(22) PCT Filed: Jul. 14, 1999

(86) PCT No.: PCT/US99/15932

§ 371 (c)(1),
(2), (4) Date: Jan. 4, 2001

(87) PCT Pub. No.: WO00/05770

PCT Pub. Date: Feb. 3, 2000

Related U.S. Application Data

(60) Provisional application No. 60/093,688, filed on Jul. 22, 1998.

(51) Int. Cl.[7] .................................................. H01L 21/00
(52) U.S. Cl. ........................................... 438/2; 505/210
(58) Field of Search ...................... 505/1, 210; 438/2

(56) References Cited

U.S. PATENT DOCUMENTS 5,215,959 A * 6/1993 Van Duzer ..................... 505/1
5,219,827 A * 6/1993 Higaki et al. .................. 505/1
5,472,935 A * 12/1995 Yandrofski et al. ......... 505/210
5,710,105 A * 1/1998 Shen .......................... 505/210
5,750,473 A   5/1998 Shen
5,914,296 A * 6/1999 Shen .......................... 505/210

FOREIGN PATENT DOCUMENTS

EP        0 534 361 A2    5/1993
JP           9045971 A *  2/1997

OTHER PUBLICATIONS

Wolf, S., Tauber R.N.; Silicon Processing for the VLSI Era vol. 1: Process Technology, Lattice Press, Sunset Beach, CA, 1986, p.p. 407–409.*

* cited by examiner

Primary Examiner—John F. Niebling
Assistant Examiner—Christopher Lattin

(57) ABSTRACT

In a process for patterning both sides of a double-sided HTS thin film wafer with the patterns in close registration, the first side is patterned with at least one reference mark and the second side is patterned with at least one aperture which permits alignment of the reference mark from the already applied pattern on the first side preferably to a similar reference mark on the yet to be applied patterns on the second side, such that the patterns can be aligned in close registration, using microcopic viewing techniques if necessary.

9 Claims, 11 Drawing Sheets

METHOD FOR DOUBLE-SIDED PATTERNING OF HIGH TEMPERATURE SUPERCONDUCTING CIRCUITS

This application claims the benefit of Provisional application No. 60/093,688 filed Jul. 22, 1998.

BACKGROUND OF INVENTION

This invention pertains to a method for applying complex patterns in close alignment with each other on both sides of a single high temperature superconducting (HTS) wafer.

In common practice in the art, a HTS thin film is deposited upon one or both sides of a thin substrate wafer. For most applications today, only one device is fabricated on a single wafer; that is, only one side of the wafer receives a pattern. The reverse side of the wafer, if employed at all, is employed as a heat sink or other structure that has no strongly preferred geometric orientation with respect to the pattern on the first side.

There is increasing interest in applications wherein it is desirable to couple two superconducting electronic devices electromagnetically at microwave or radio frequencies. Such applications include microwave power transmission, bandwidth and bandpass filters, and imaging, such as magnetic resonance imaging (MRI). In such applications, there is a considerable benefit to laying down the devices to be coupled on opposite sides of the same wafer. In addition, the patterns on the two sides often need to be aligned to micron scale in order to achieve optimum performance.

While the substrates commonly employed in the art, such as $LaAlO_3$, sapphire, MgO, $NdGaO_3$ and yttria stablized zirconia are themselves transparent at visible wavelengths, the HTS thin films, such as $Tl_2Ba_2CaCu_2O_8$ or $YBa_2Cu_3O_{7-x}$ are opaque at all practical wavelengths. The result is that the first patterned side is not visible while applying the pattern to the opposite side, which makes registration of the two patterns extremely difficult. Two-sided patterned waters are disclosed in Shen, U.S. Pat. No. 5,750,473. Until now, the best known method in the art for fabricating such a device is represented by the model MA6 Mask Aligner manufactured by Karl Suss K G GmbH & Co., Munich, Germany. The MA6 is a complicated apparatus equipped with both bottom side and top side microscopes and image storage capabilities employed to permit simultaneous viewing of the two sides of the opaque wafer. The major drawback for an apparatus such as the MA6 is that no matter what equipment configuration is employed, there will be some device geometry which requires placement of reference marks which will be inaccessible to the optical configuration in place in any device such as the MA6. In most instances, the optical configuration could be changed to accommodate the new sample geometry, but this is an expensive and time consuming undertaking at best. Thus, the art does not provide a flexible means to achieve double-sided patterning of HTS wafers of arbitrary geometry aligned with micron scale precision.

SUMMARY OF THE INVENTION

The present invention provides for a method for providing alignment reference marks on opposing sides of a double-sided high temperature superconducting wafer comprising the steps of:

applying at least one reference mark to a first high temperature superconducting thin film on a first side of a transparent wafer substrate;

patterning a second high temperature superconducting thin film on a second side of the wafer to provide at least one window aperture through which said at least one reference mark is visible.

BRIEF DESCRIPTION OF THE FIGURES

FIGS. 1–4 provide a schematic illustration of the method of the invention, in which:

FIG. 1 shows the patterned first side of an HTS wafer with reference marks;

FIG. 2 shows the unpatterned second side after the etching of windows therein at the approximate location of the first side reference marks;

FIG. 3 shows the initial positioning of the photomask carrying the pattern to be applied to the second side of the wafer, the photomask having reference marks not fully aligned with those on the first side; and FIG. 4 shows the final positioning of the photomask after precision of alignment of the photomask reference marks with the first side reference marks visible through the second side windows.

DETAILED DESCRIPTION OF THE INVENTION

Figure 1:
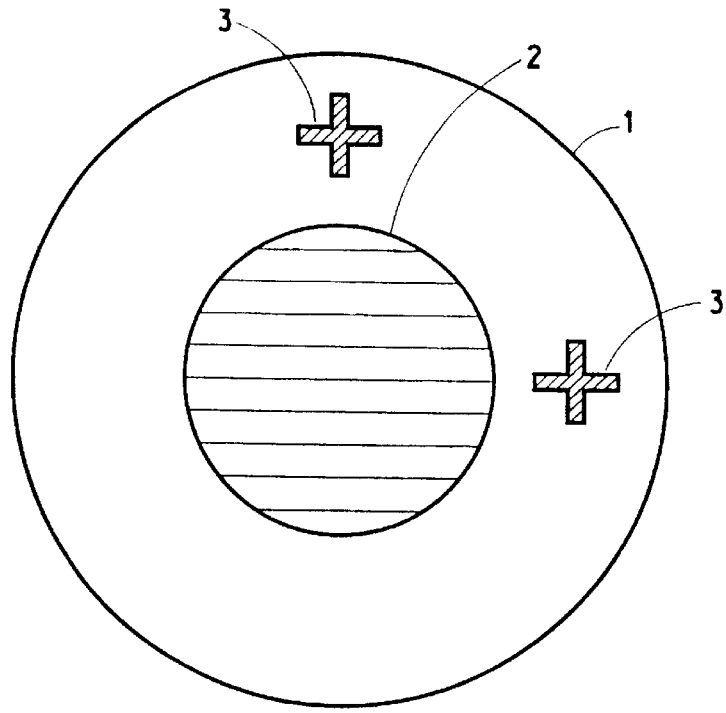

This invention is directed to a method for double-sided patterning of two sided HTS thin film wafers.

The key step in the fabrication of double-sided patterned devices on wafers is to etch transparent "windows" in the wafer. The window openings reveal an alignment mark disposed on the already applied pattern on the front side that defines the alignment registration for the second pattern to be applied to the second side. Precision alignment controls allow the photomask for the second side to be precisely overlaid with respect to the first side reference marks. Using optical microscopy to guide the alignment, precision between the front and back surfaces is better than 5 micrometers.

Suitable substrates for the practice of the present invention are those that are transparent in the visible or near infrared portion of the electromagnetic spectrum. Most preferred are substrates that are transparent in the visible region. Of course, the substrate must be receptive to the deposition of high temperature superconducting (HTS) thin film. Particularly preferred substrates include $LaAlO_3$, sapphire, MgO, $NdGaO_3$, yttria stablized zirconia, quartz and strontium titanate, for example.

There is no particular limitation on the shape of the substrate. Typically, the substrates are in the shape of thin, round wafers approximately 500 micrometers in thickness and 5.08 or 7.62 centimeters (2 inch or 3 inch) in diameter.

The process of this invention may be practiced with any known HTS thin film material. Such HTS materials include $Tl_2Ba_2CaCu_2O_8$, $YBa_2Cu_3O_{7-x}$, $(Tl, Pb)Sr_2Ca_2Cu_3O_9$, BiPbSrCaCuO, BiSrCaCuO, BiSrCuO, BiSrYCuO and others.

There is no limit in principle to the manner of deposition of the HTS on the substrate and any of the known, commonly used methods, such as off-axis magnetron sputtering (in situ or ex situ, the so called "two-step process", laser ablation, etc.) may be employed. Off axis magnetron sputtering and laser ablation are particularly preferred. It is not strictly necessary to deposit the HTS film on both sides at one time, but it is preferred. The thin film is typically deposited to a thickness of about 0.4 to 0.7 microns, but that is not critical to the practice of the invention.

The HTS thin films such as are known in the art, are opaque in the visible and near-infrared portions of the spectrum. The underlying principle of the present invention is that reference marks on a first patterned side of a wafer can be made visible by opening windows on the second, not-yet-patterned side in approximate registration with the reference marks on the first side. Once the windows are open, the application of the second pattern may proceed in precise alignment with the now visible reference marks on the first pattern.

Any convenient means of applying the reference marks to the first side of the HTS thin film wafer is suitable, and the practice of the present invention is not limited to any particular means. A preferred method is to create the reference marks as part of the photomask design for the first pattern to be applied. However the reference marks may be applied by numerous other means. the only criterion being that they must be clearly observable from the other side after the windows are "opened." The number of reference marks and their distribution on the first side of the wafer is not limited in any way except that they must be applied to avoid interference with the performance of the thin film HTS device deposited. For instance, it is customary in preparing wafers to leave a gap of about 2 mm around the periphery of the substrate where no HTS film is deposited. The reference marks can be conveniently located in this gap so as not to interfere with the pattern of interest. Preferably, there are two reference marks, but there could be more; and, one will sometimes suffice.

The actual process of patterning the HTS thin films is well-known in the art and thus need not be explained in great detail. Essentially a photoresist, such as poly(methyl methacrylate), is applied to the HTS thin film by any convenient coating technique such a spin coating. A negative image of the desired pattern is made in a photomask which is then overlaid onto the photoresist and the photoresist layer is exposed or irradiated through the photomask, causing the photoresist to polymerize and harden in the exposed areas. The photoresist layer is then developed to remove the unexposed (unpolymerized) areas and the underlying HTS film is etched by, e.g., ion beam etching, to create a pattern in the HTS film. The polymerized areas of the photoresist layer are then removed, leaving the patterned HTS film.

In the preferred practice of the invention, the reference marks are incorporated into the pattern. However, it should be understood that other means could be employed to apply the reference marks. For example, reference marks could be created by physically notching the substrate. Such would need to be done after the HTS films are annealed, however, otherwise there is a good probability that the substrate will be damaged during firing.

After the first side of the double-sided wafer is patterned, the opposite side is patterned in the same manner. The principle difference being, that the second side is patterned with windows which, when "opened" will reveal the reference marks from the first side. In the preferred practice of the invention, the opposite or second side of the wafer is patterned in phases. In the first phase, a photomask consisting only of the windows, is prepared and applied over the photoresist. The photoresist is then exposed, developed and stripped as on the first side after etching the HTS film. These process steps open the windows. While the windows need not be any particular size, they should be large enough to permit viewing of the reference marks with unaided visual alignment of the photomask to the patterned side. In addition, the size of the window is a function of the tolerance of the equipment used to align the patterns. The higher the degree of precision on the equipment, the smaller the windows can be. Generally speaking, a square-shaped window of approximately 0.5 mm per side is sufficient.

Once the windows are opened and the reference marks from the first side are visible, another photoresist layer is applied and another photomask containing the desired circuitry pattern is applied to the resist layer. Before application of the pattern to the second side, the reference marks of the first side, visible through the windows, and the reference marks on the photomask containing the desired pattern of circuitry for the second side are brought into precise alignment. Once the alignment of the reference marks and/or windows has been made the second side is exposed, developed, etched and stripped as above, leaving a wafer having two patterned HTS films in close registration with one another.

In order to achieve high precision alignment, it is preferred to observed and manipulate the alignment of the reference marks under some form of magnification. A preferred method of magnification is to use a vibration isolation table and 50× or 100× magnification (10× eyepiece and either 5× or 10× optics).

While not required for the practice of the present invention, it is found that for practical reasons, it is desirable to apply the photopolymer to both sides of the HTS wafer in order to protect the side which isn't undergoing patterning from physical damage in handling.

With reference being made to FIGS. 1–4, the process as generally described above is illustrated schematically. It should be noted that for the purpose of illustration the reference marks are disproportionately large compared with the patterns. It is anticipated that in most cases of practical interest, the reference marks will be much smaller compared to the pattern, and will likely require magnification of about 50–100× to achieve proper alignment.

Figure 2:
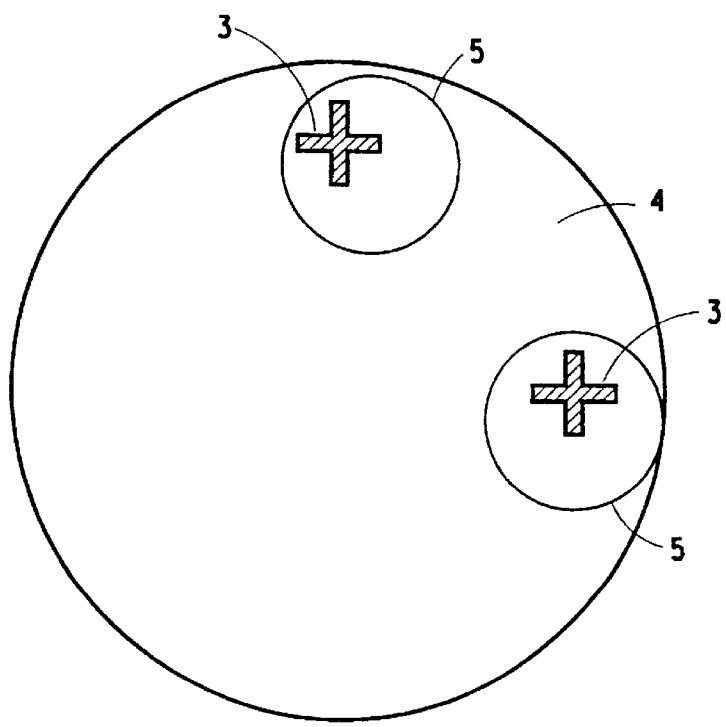
Figure 3:
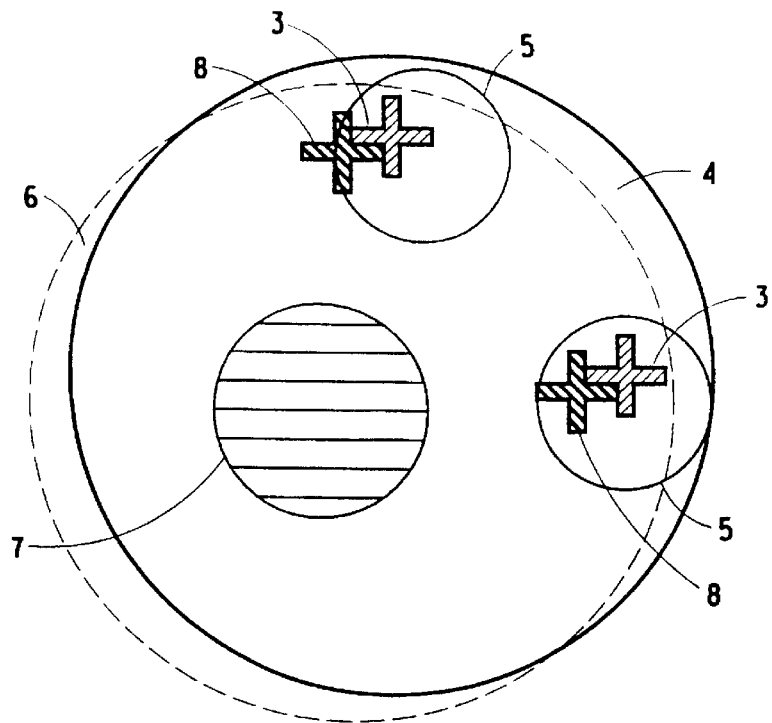
Figure 4:
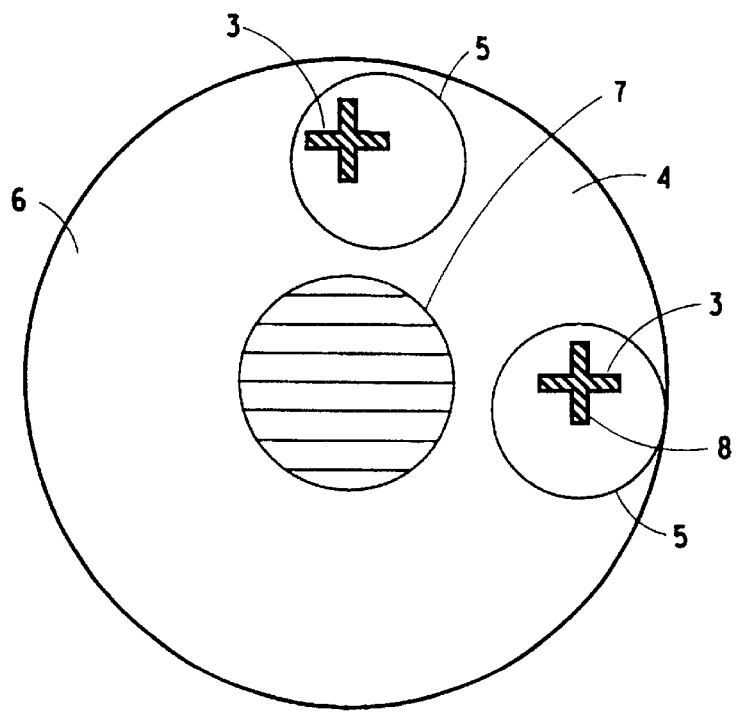

In FIG. 1, the first side of the HTS-thin-film-coated wafer 1, has been patterned using a first photomask, and both device 2, and reference marks 3, have been applied. In FIG. 2, the second side of the HTS-thin-film-coated wafer 4, has been patterned with windows 5, using a second photomask, the windows being imperfectly aligned with the first-side reference marks, making visible the first side reference marks. In FIG. 3, a third photomask 6, having both the device pattern 7, to be applied to the second side of the HTS-thin-film-coated wafer, and reference marks 8, to provide alignment with the device pattern on the first side, is positioned in imperfect alignment with the pattern on the first side. In FIG. 4, the third photomask is shown in precise alignment with the pattern on the first side as a result of bringing the reference marks into precise alignment.

EXAMPLES

Example 1

Figure 5A:
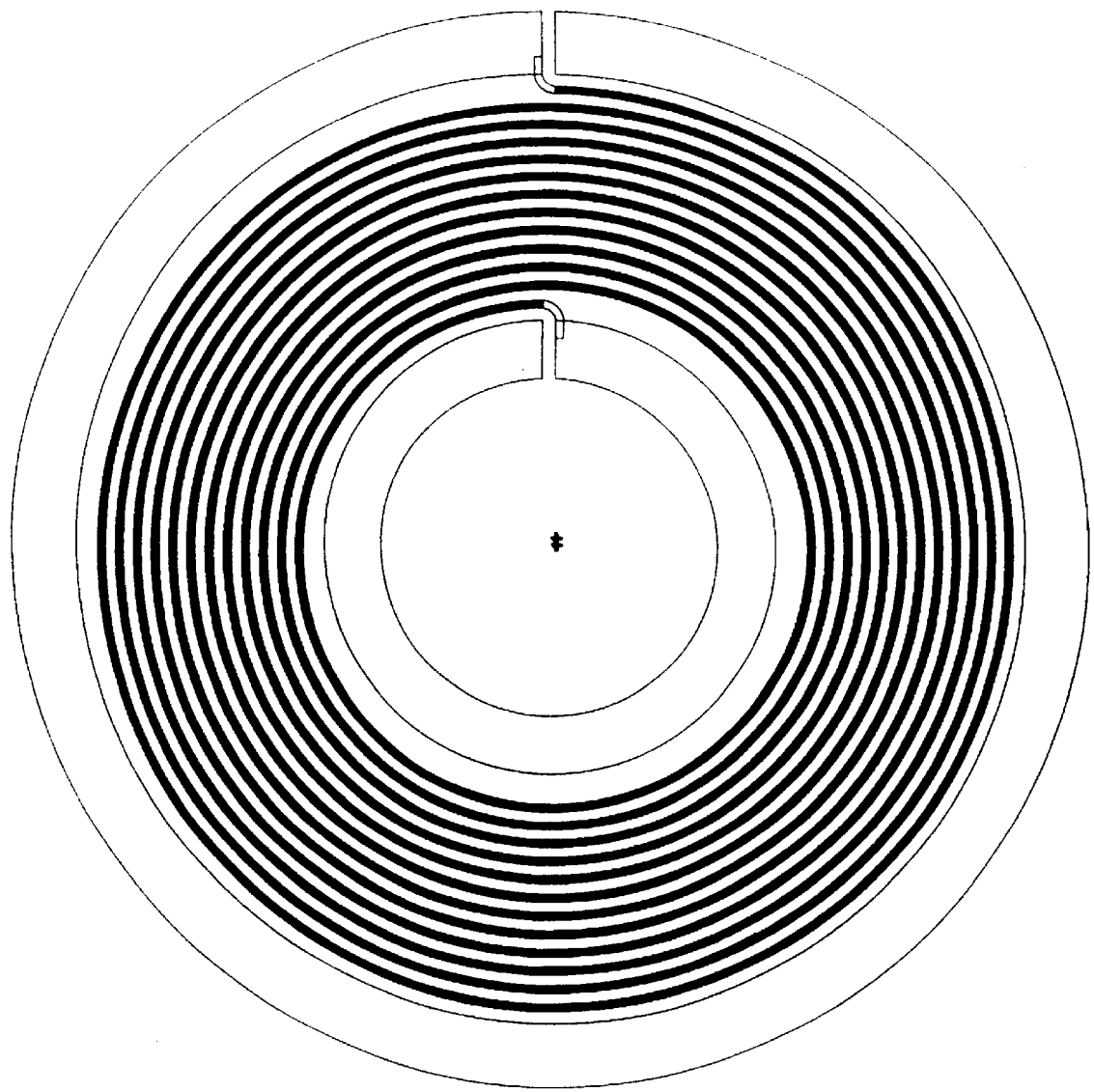
FIGS. 5a–5c depict respectively the first side pattern, the window apertures and the second side patterns for use in a magnetic resonance imaging device.

A 0.7 micrometer thick film of $Tl_2Ba_2CaCu_2O_8$ was deposited using off-axis magnetron sputtering and a standard two-step post anneal process on a both sides of a 0.5 mm thick LaAlO$_3$ wafer 5.08 cm in diameter. Using a Model PM101DT Headway Spinner, a solution of a poly(methyl methacrylate) photoresist, 9% solids in chorobenzene (available from OCG-Olin Chemical Corporation), was spun coated onto both the front and back surfaces of the wafer to coating thickness of 1.2 micrometers. The photoresist was then baked at 170° C. for 30 minutes in a Model LC-02-W Lindberg Blue-M Oven in a nitrogen atmosphere. A 1.8 micrometer layer of Hoechst AZ 5214 positive resist was spin coated as above onto the photoresist layer on one side of the wafer. After a 90° C. post-bake in the Lindberg Blue-M Oven, the AZ 5214 positive resist was exposed to UV light in the range of 137.5 mJ per square cm through a photomask pattern and incorporating reference marks as shown in FIG. 5a. The exposed AZ 5214 photoresist was then developed by immersion in ion free AZ 422MIF developer Hoechst) for 1 minute and 40 seconds.

After exposure and development of the AZ 5214 resist, the wafer was subjected to an oxygen plasma using a YES-CV100PZ Downstream Oxygen Plasma Stripper (Yield Engineering Systems. Inc.) operating at 500 W power and 160 Pascal (1.2 Torr) pressure at 90° C. for 20 seconds to descum the wafer. The pattern was then transferred to the poly(methyl methacrylate) photoresist by flood exposure to deep (220–260 nm) UV light using a 500 watt, Model 83210 deep UV light source (Oriel Corporation) at 10 J per square centimeter. The resist layer was then development in toluene at 70° C. for 4.5 minutes. The HTS film was then etched by argon ion beam milling using a Model LL-250 Microtech (Veeco Instruments). The Ar+ ion beam energy was 500 eV and the beam current was 500 mA. The beam was directed along the film normal. During milling, the wafer was cooled from behind by a helium coolant gas. The residual photoresist was removed with an oxygen plasma using the Plasrha Stripper mentioned above at 150° C. for 3 minutes. This completed the patterning of the front side.

Figure 5B:
Figure 5C:
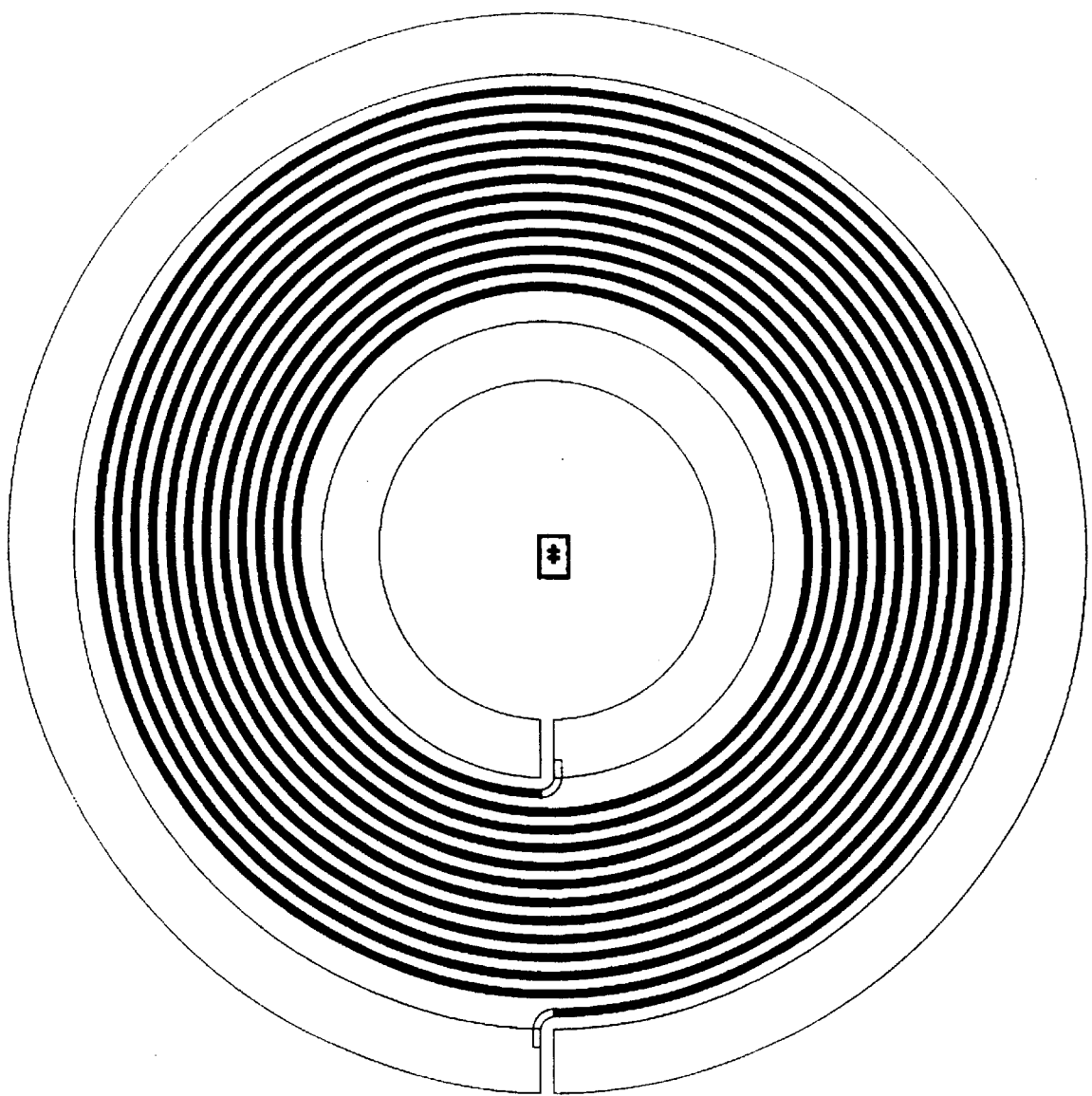
Figure 6A:
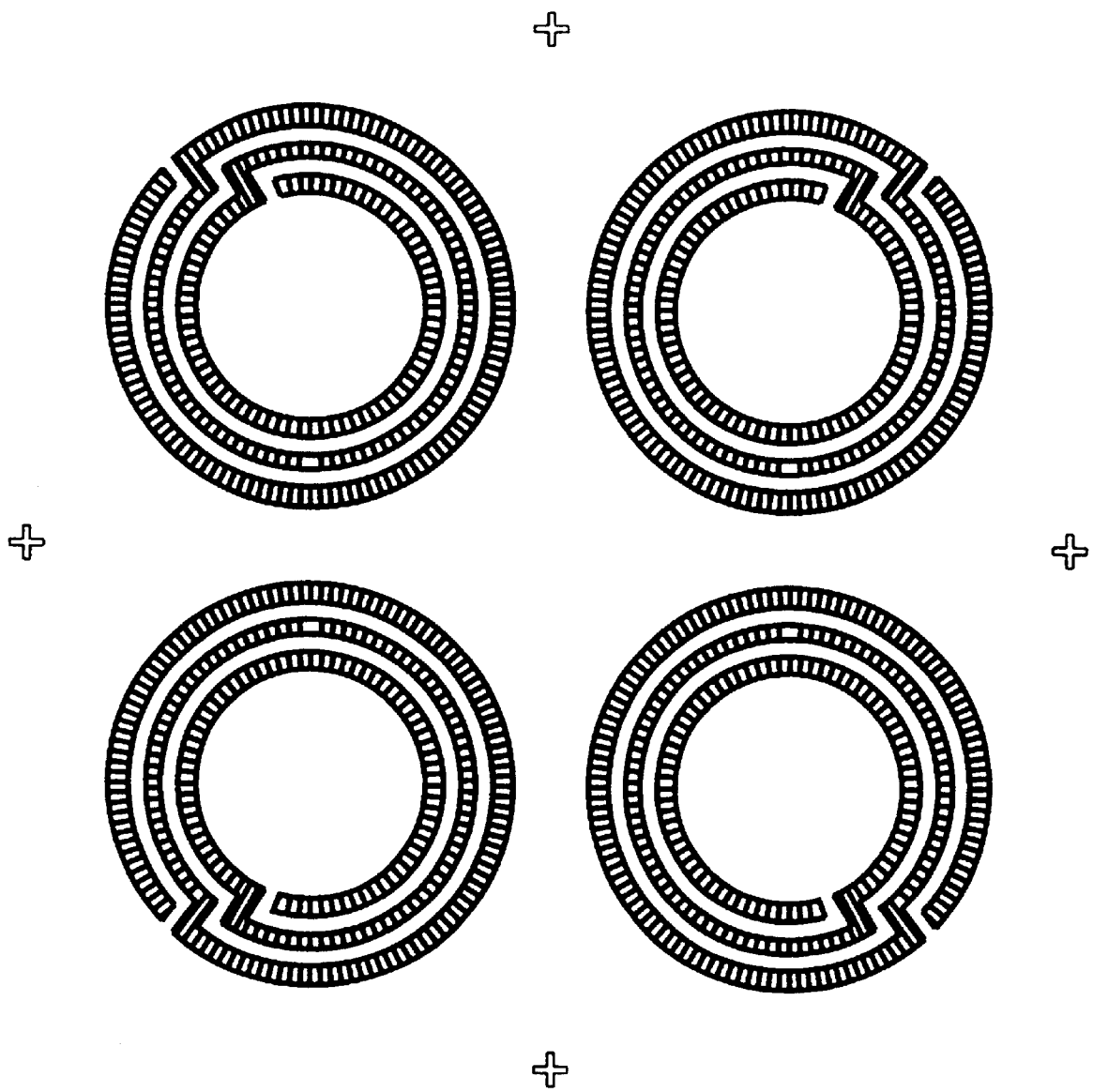
FIGS. 6a–6c depict respectively the first side pattern, the window apertures and the second side patterns for use in a nuclear magnetic resonance spectrometer.
Figure 6B:
Figure 6B:
Figure 6B:
Figure 6B:
Figure 6C:
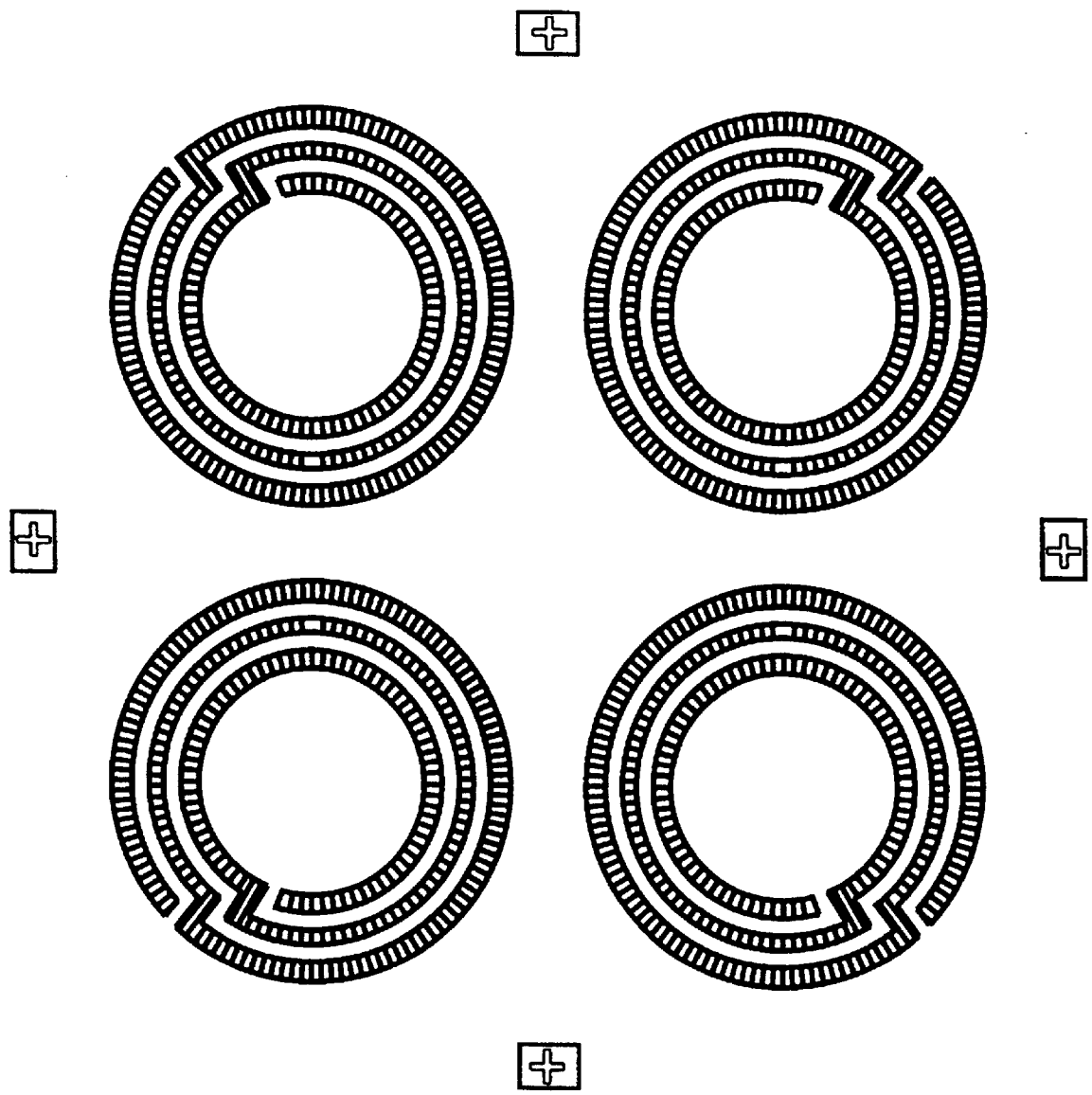

The opposite side of the wafer was then patterned as follows. A mask consisting of a single window as shown in FIG. 5b was employed and, using the techniques described above, the window was opened to permit viewing of the reference mark on the opposite side of the wafer. Then another photomask having the pattern shown in FIG. 5c was used and was aligned to the pattern already applied to the front side of the wafer using a model MA6 Mask Aligner. Subsequent to the alignment, the exposure, development, and etching procedures described above were used to complete the patterning of the second side of the wafer and thus create a double-sided HTS wafer patterned on both sides.

Example 2

The procedures of Example 1 were exactly replicated except that a 0.6 micrometer thick film of YBa$_2$Cu$_3$O$_7$ was deposited on both sides of a 0.5 mm thick sapphire wafer 5.08 cm in diameter and the photomasks were as shown in 6a–6c.

Example 3

Figure 7A:
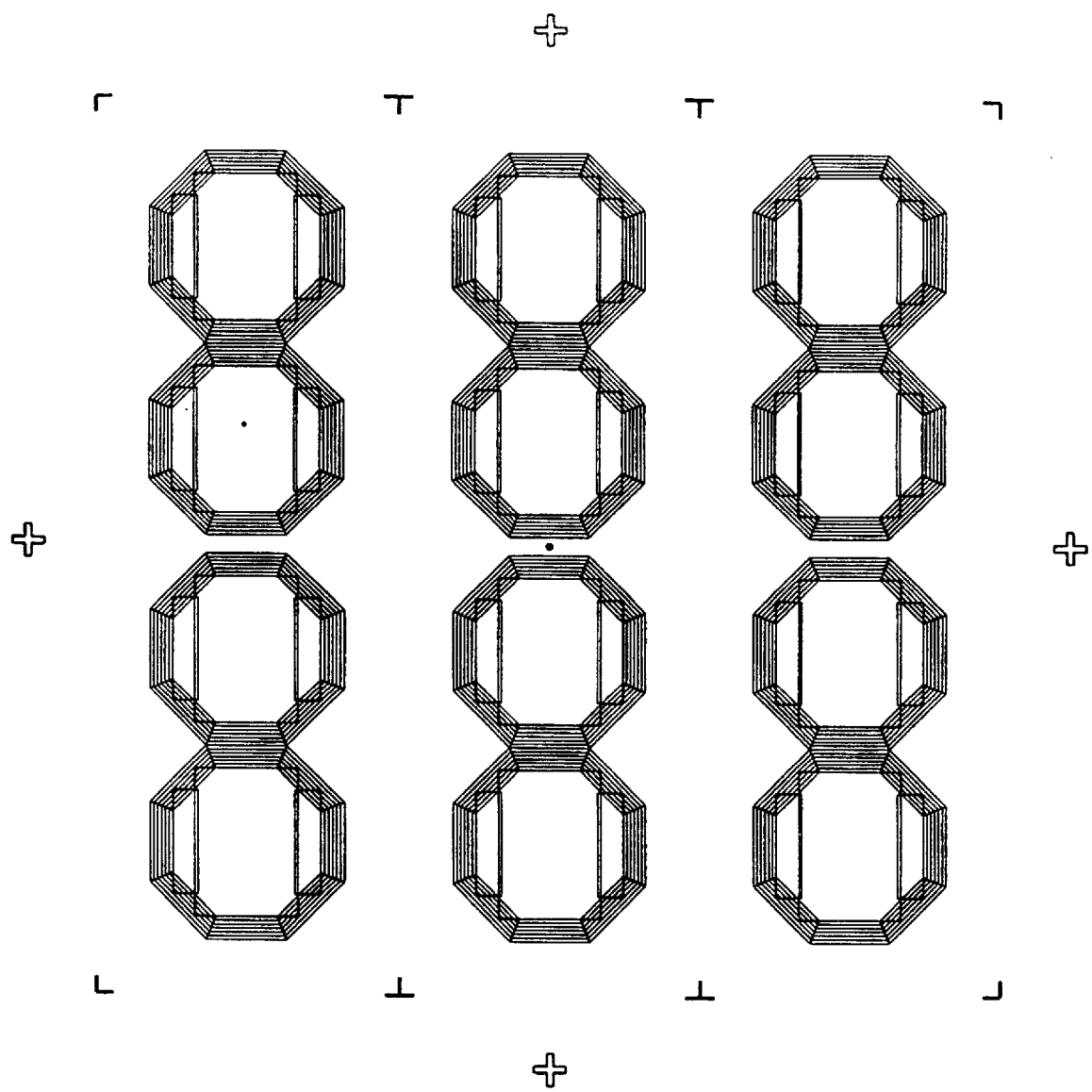
FIGS. 7a–7c depict respectively the first side pattern, the window apertures and the second side patterns for use in a microwave transmission power filter.
Figure 7B:
Figure 7B:
Figure 7B:
Figure 7B:
Figure 7C:
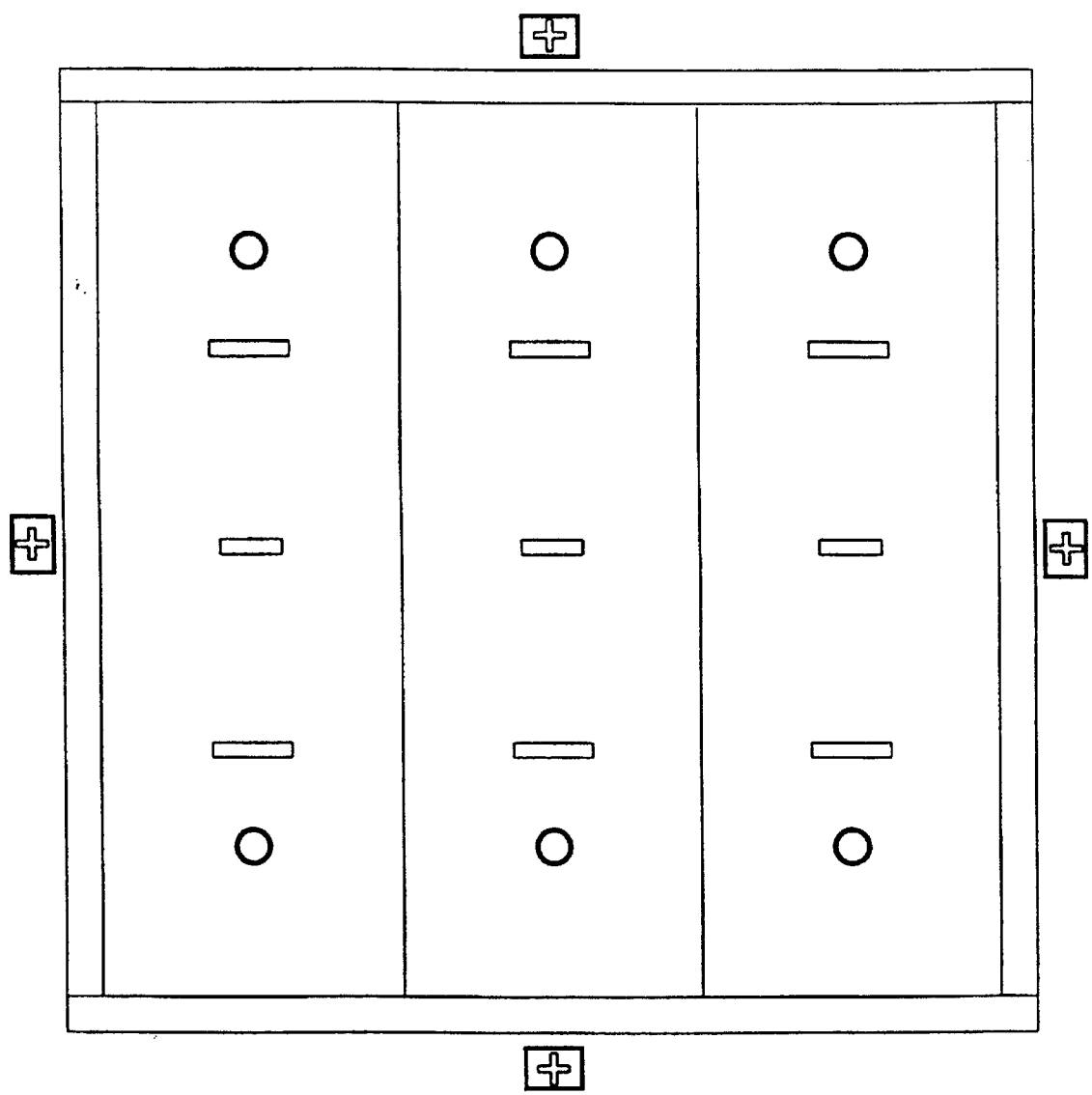

The procedures of Example 1 were exactly replicated except that a 0.7 micrometer thick film of Tl$_2$Ba$_2$CaCu$_2$O$_8$ was deposited on both sides of a 0.5 mm thick sapphire wafer 5.08 cm in diameter. and the photomasks were as shown in FIGS. 7a–7c.

What is claimed is:

1. A method of aligning a pattern on a side of a double-sided high temperature superconducting wafer comprising the steps of:

applying at least one reference mark to a first high temperature superconducting thin film on a first side of a transparent wafer substrate;

opening a window aperture in a second high temperature superconducting thin film on a second side of said wafer through which said at least one reference mark is visible; and aligning a pattern on the second side of the wafer according to the at least one reference mark.

2. The method of claim 1 further comprising patterning at least one side of said wafer to form an electronic device.

3. The method of claim 2, further comprising sequentially patterning both sides of said wafer to form an electronic device on each.

4. The method of claim 3 wherein the second pattern to be applied is brought into precise alignment with the first applied pattern by alignment with said at least one reference mark prior to the step of applying the second pattern onto the high temperature superconducting wafer.

5. The method of claim 2, wherein the at least one reference mark and the pattern of the electronic device are simultaneously applied to the first side of the wafer.

6. The method of claim 1, wherein said aligning step comprises:

a) applying a photoresist to said second high temperature superconductor thin film;

b) applying a photomask to said photoresist, said photomask consisting solely of at least one window aperture approximately corresponding in location to the at least one reference mark on the first high temperature superconductor thin film;

c) irradiating the photoresist layer through said photomask to polymerize said photoresist in the exposed areas;

d) developing the photoresist to remove unpolymerized areas corresponding to the at least one window aperture; and e) etching the second high temperature film to create a window aperture therein, to reveal the at least one reference mark on the first high temperature superconductor thin film.

7. The method of claims 2 or 3 wherein the step of patterning comprises the steps of:

a) applying a photoresist to said first high temperature superconductor thin film;

b) applying a photomask to said photoresist;

c) irradiating the photoresist layer through said photomask to polymerize said photoresist in the exposed areas;

d) developing the photoresist to remove unpolymerized areas;

e) etching the first high temperature film; and f) removing the polymerized areas of the photoresist.

8. The method of claim 1, wherein the transparent substrate is selected from the group consisting of include LaAlO$_3$, sapphire, MgO, NdGaO$_3$, yttria stablized zirconia, quartz and strontium titanate.

9. The method of claim 1, wherein the first and second high temperature superconductor thin films are selected from the group consisting of Tl$_2$Ba$_2$CaCu$_2$O$_8$, YBa$_2$Cu$_3$O$_{7-x}$, (Tl, Pb)Sr$_2$Ca$_2$Cu$_3$O$_9$, BiPbSrCaCuO, BiSrCaCuO, BiSrCuO and BiSrYCuO.

* * * * *